United States Patent [19]

Leiser et al.

[11] 4,130,707

[45] Dec. 19, 1978

[54] ADHESIVE COMPOSITIONS

[75] Inventors: Manfred Leiser; Karl-Heinrich Wegehaupt; Wilhelm Marsch, all of Burghausen, Germany

[73] Assignee: Wacker-Chemie GmbH, Munich, Germany

[21] Appl. No.: 793,576

[22] Filed: May 4, 1977

Related U.S. Application Data

[60] Division of Ser. No. 546,246, Feb. 3, 1975, Pat. No. 4,051,454, which is a continuation of Ser. No. 443,533, Feb. 19, 1974, abandoned.

[30] Foreign Application Priority Data

Feb. 16, 1973 [DE] Fed. Rep. of Germany ....... 2307776

[51] Int. Cl.$^2$ ............................................. C08G 77/04
[52] U.S. Cl. ...................... 528/15; 156/329; 252/511; 252/512; 252/514; 260/825; 260/37 SB; 427/387; 428/447; 528/31; 528/32; 528/43
[58] Field of Search ................. 260/46.5 UA, 46.5 G, 260/825; 156/329; 252/511, 512, 514; 427/387; 428/447

[56] References Cited

U.S. PATENT DOCUMENTS

| | | | |
|---|---|---|---|
| 3,516,946 | 6/1970 | Modic | 252/429 |
| 3,532,649 | 10/1970 | Smith et al. | 260/18 |
| 3,677,981 | 7/1972 | Wada et al. | 260/2.5 S |
| 3,714,204 | 1/1973 | Lamont | 260/37 SB |
| 3,814,731 | 6/1974 | Nitzsche et al. | 260/46.5 UA |
| 3,882,083 | 5/1975 | Berger et al. | 260/46.5 UA |
| 4,051,454 | 9/1977 | Leiser et al. | 156/329 |

OTHER PUBLICATIONS

Encyclopedia of Polymer Science and Technology, vol. 1, pp. 445 and 446, (1964).

*Primary Examiner*—Melvyn I. Marquis

[57] ABSTRACT

The invention relates to adhesive compositions comprising vinyl containing organopolysiloxanes, organopolysiloxanes having Si-bonded hydrogen atoms and catalysts which promote the addition of the Si-bonded hydrogen atoms to the vinyl groups.

These adhesives may be combined with other electrically conductive materials and used in connecting flexible heating resistors to electrodes.

5 Claims, No Drawings

ADHESIVE COMPOSITIONS

This is a division of application Ser. No. 546,246, filed Feb. 3, 1975, now U.S. Pat. No. 4,051,454, which is a continuation of Ser. No. 443,533, filed Feb. 19, 1974, now abandoned.

The present invention relates to adhesive compositions and more particularly to adhesive compositions which may be used to connect flexible resistors to electrodes.

Adhesive compositions which form elastomeric or resinous compounds are disclosed in German patent specification No. DT-OS-19 40 124 and DT-OS 20 17 826. These adhesive compositions are prepared from vinyl containing organopolysiloxanes, organopolysiloxanes having Si-bonded hydrogen atoms and catalysts which promote the addition of Si-bonded hydrogen atoms to vinyl groups.

When compared with these known adhesives, the compositions of this invention have serveral advantages over the adhesives disclosed in the German patent specifications. For example, the adhesives of this invention exhibit substantially better adhesion and produce a stronger and better heat resistant bond. The heat resistant property is of course especially important in connecting flexible resistors to electrodes. The use of electrically conductive room temperature curable elastomers for connecting flexible resistors to electrodes is disclosed in U.S. Pat. No. 3,387,248 to Rees. However, the bond between the electrodes and resistors which are obtained with the adhesives of this invention are considerably stronger than the bond which is obtained by using the composition of the above cited U.S. patent.

The high degree of strength of the adhesive bond obtained with the compositions of this invention is indeed surprising. For instance, German patent specification No. DT-OS 19 40 124 states that compounds based on a SiH-olefin addition type curing systems are generally incapable of adhering to other materials, whereas the compositions of this invention provide excellent adhesion, even though they do not contain any of the resinous adhesion promoting organopolysiloxanes which are the essential components of the above cited German patented specifications.

It is therefore an object of this invention to provide organopolysiloxane compositions having good adhesive properties. Another object of this invention is to provide adhesive compositions which are resistant to high temperatures. Still another object of this invention is to provide adhesive compositions which may be used to connect flexible heat resistors to electrodes.

The foregoing objects and others which will become apparent from the following description are accomplished in accordance with this invention, generally speaking, by using a composition which is capable of curing to an elastomer as an adhesive to connect flexible heat resistors to electrodes. The adhesive compositions of this invention contain organopolysiloxanes having vinyl containing groups, organopolysiloxanes having Si-bonded hydrogen atoms and catalysts which promote the addition of Si-bonded hydrogen atoms to the vinyl groups.

The organopolysiloxanes containing vinyl groups should have a viscosity of at least 100,000 cp. at 25° C. and consist of diorganopolysiloxanes having from 0.1 to 1.0 mol percent of vinylmethylsiloxane units. These vinyl containing organopolysiloxanes contain no other vinly groups other than the vinylmethylsiloxane units and triorganosiloxy groups and the remaining organic radicals are methyl groups and phenyl groups.

It is preferred that the terminal groups of the vinyl containing organopolysiloxanes be vinyl containing triorganosiloxy groups. The vinyl containing organosiloxanes employed in this invention may be represented by the general formula $$R_2(CH_2=CH)SiO(R'_2 SiO)_n SiR_2(CH=CH_2),$$

in which R represents a methyl or phenyl group, R' represents a methyl, vinyl or phenyl group with the provision that each R' vinyl group be present as a vinylmethylsiloxane unit and that 0.1 to 1 mol percent of the diorganosiloxane units ($R'_2SiO$) be vinylmethylsiloxane units and further that 90 percent of the total number of the R and R' groups, less the R' radicals, which are vinyl groups, consist of methyl groups and n represents a number which is sufficient to provide an organopolysiloxane having a viscosity of at least 100,000 cp. at 25° C.

If desired, all or a portion of the vinyl groups in the triorganosiloxy groups may be replaced with R groups.

The viscosity of the organopolysiloxanes containing vinyl groups which are employed in the compositions of this invention should not be less than 100,000 cp. at 25° C., otherwise an adhesive bond of suitable strength cannot be achieved. The upper limit for the viscosity of the vinyl containing organopolysiloxanes is not critical as long as the composition is used in the form of a solution or a dispersion in organic solvents and the solution is sufficiently flowable. It is however, preferred that the viscosity of the vinyl containing organopolysiloxanes be below about $10 \times 10^6$ cp. at 25° C.

If the organopolysiloxanes having vinyl groups contain less than 0.1 mol percent of the diorganosiloxane units in the form of vinylmethylsiloxane units, the adhesive bond thus obtained does not have satisfactory strength. If more than 1 mol percent of the diorganosiloxane units are in the form of vinylmethylsiloxane units, the adhesive bond thus obtained is not as flexible as would be desired.

In the vinyl containing organopolysiloxanes, generally, at least 90 percent of the organic radicals other than the vinyl groups are methyl groups.

Although this is generally not indicated in the formula, siloxane units in addition to the diorganosiloxane units ($R'_2SiO$) may be present within and/or along the siloxane chain. Examples of such other siloxane units which are mostly only present as impurities, are ones which correspond to the general formula $R SiO_{3/2}$, $R_3SiO_{1/2}$ and $SiO_{4/2}$, where R has the same meaning as above. The amount of such other siloxane units however, should be exceed about 1 mole percent.

The vinyl containing organopolysiloxanes used in this invention are well known and may be prepared in accordance with the procedure described in German patent specification No. DT-AS 17 45 572 (Example 3).

Any organopolysiloxane having Si-bonded hydrogen atoms which have been used heretofore with vinyl containing organopolysiloxanes and catalysts that promote the addition of Si-bonded hydrogen atoms to vinyl goups to form elastomers, may be used in the preparation of the adhesive compositions of this invention. These organopolysiloxanes should contain at least three Si-bonded hydrogen atoms and have from 0.01 to 1.7 percent by weight of Si-bonded hydrogen atoms. The silicon atoms which are not saturated with hydrogen atoms or siloxane oxygen atoms, are saturated with monovalent hydrocabon radicals which are free of aliphatic unsaturation, with the further provision that the hydrocarbon radicals bonded to the silicon atoms containing the Si-bonded hydrogen atoms are predominately methyl radicals.

Examples of suitable monovalent hydrocarbon radicals free of aliphatic unsaturation and having up to 8 carbon atoms are methyl, ethyl, n-propyl, iso-propyl, butyl, hexyl, octyl and phenyl groups. In order to obtain particularly good adhesion it is preferred that the organopolysiloxanes contain at least three Si-bonded hydrogen atoms per molecule and contain from 0.3 to 1 Si-bonded hydrogen atom per Si-atom and at least 100 siloxane units per molecule. Organopolysiloxanes having Si-bonded hydrogen atoms are generally known and are marketed by Dow Corning Corporation under the name "DC 1107. " These organopolysiloxanes having Si-bonded hydrogen atoms may be linear, cyclic or branched. When linear, the terminal units are generally trimethylsiloxy groups.

The organopolysiloxanes having Si-bonded hydrogen atoms are generally employed in such an amount that from 0.75 to 5 gramatoms of Si-bonded hydrogen is present per gram-molecule of vinyl group in the vinyl containing organopolydsiloxanes.

Any catalyst which promotes the addition of Si-bonded hydrogen atoms to vinyl groups may be employed in this invention. Examples of suitable catalysts are the elements of Group VIII of the periodic system, according to Mendeleeff ("Handbook of Chemistry and Physics" 31st edition, Cleveland, Ohio 1949, pages 334 and 335) and their compounds or complexes, such as platinum and platinum compounds or complexes, e.g., platinum/carbon, chloroplatinic acid, platinum-olefin or platinum-ketone complexes. Other catalysts which may be employed are palladium and its compounds, rhodium compounds, cobalt carbonyl and the like.

Platinum and platinum compounds or platinum complexes are preferrably employed in amounts of from 5 to 500 ppm and more preferably from 5 to 100 ppm, calculated as Pt and based on the total weight of the composition.

The compositions employed in accordance with this invention may also contain other additives which are customarily employed in organopolysiloxane compositions. Such additives must, of course, not impede the activity of the catalysts which promote the addition of the Si-bonded hydrogen atoms to the vinyl groups, nor should they have a detrimental effect upon the hardness or the heat resistance of the adhesives. Examples of suitable additives which may be used are reinforcing fillers, agents for reducing the effects of "structure formation" or "crepe aging", as well as organosilanols or low-molecular weight organopolysiloxanes having Si-bonded hydroxyl groups. Other additives which may be employed are those materials which have a desirable effect upon the electrical properties of the addhesives, or materials which impede or delay the curing of the composition at room temperature, nonreinforcing fillers, pigments, soluble dyes and softeners as well as liquid dimethylpolysiloxanes which are end-blocked by trimethylsiloxy groups and solvents.

Examples of reinforcing fillers, i.e., fillers having a surface area of at least 50 m$^2$/g are pyrogenic silicon dioxide, silicic acid hydrogels which have been dehydrated while their structure has been maintained and precipitated silicon dioxide with a surface area of at least 50 m$^2$/g. Examples of suitable non-reinforcing fillers, i.e., fillers having a surface area of less than 50 m$^2$g are diatomaceous earth and quartz powder. Fillers which have been pretreated with trimethylchlorosilane to form organosilyl groups on the surface such as disclosed in U.S. Pat. No. 2,610,167 to Te Grotenhuis, may also be used in the compositions of this invention. Particularly good adhesion has been obtained when reinforcing fillers are employed in amounts of from 5 to 50 percent by weight based on the weight of the vinyl containing organopolysiloxanes.

Materials which have a desirable influence upon the electrical properties of the adhesives are conductive carbon, such as for example, the various known types of carbon black, graphite and powdered metals which are conductive and solid at room temperature, such as copper, aluminum and/or silver. It is possible to employ compounds having varying electrical conductivity in these compositions. When electrically conductive adhesive bonds are desired, the electrically conductive agents are generally employed in amounts of from 0.05 to 3 percent by weight based on the total weight of the organopolysiloxanes employed in the composition.

Materials which have a retarding or delaying effect on the curing of these compositions at room temperature are benzotriazole, dialkylformamide and alkylthioureas.

Solvents which may be employed are aliphatic hydrocarbons and halogenated hyderocarbons, such as trichloroethylene and perchloroethylene and aromatic hydrocarbons such as toluene and xylene.

In order that these substances may be easily worked, it is preferred that the amount of solvent employed by at least equal to the volume of the organopolysiloxane which contains the vinyl groups. However, the amount of solvent employed should not be so great that the concentration of the composition is below about 4 percent by weight, based on the total weight of the composition and the solvent, otherwise precipitation of the fillers and/or conductive agents may occur.

If during the preparation of the adhesive compositions of this invention, other additives, such as materials which induce electroconductivity are employed, then the solvent may be mixed with the organopolysiloxanes either before or after the organopolysiloxanes have been mixed with the remaining components, such as the material which induces electrical conductivity.

The coatings that are obtained by curing the compositions of this invention exhibit excellent adhesion to electrodes and area heating resistors which are generally composed of metals, such as copper and aluminum, even though these metals have not been pretreated with a primer. These coatings exhibit excellent adhesion on organopolysiloxane elastomers, organic plastics, such as olefinic addition polymers and condensation polymers containing carbonyl groups such as polyethylene terephthalate and polyimides. One of the preferred embodiments of this invention is to use these compositions, especially when they are electrically conductive, for connecting electrodes to area heating resistors which contain organopolysiloxane elastomers, or organic plastics, such as olefinic addition polymers and condensation polymers which contain carbonyl groups, as binding agents.

For this reason, the composition of this invention are particularly suited for connecting surface heating resistors to insulating films which contain organic polymers obtained from the olefinic addition and/or carbonyl groups, in order to insulate the resistor material. Another advantage of this invention is that these compositions, when entirely or almost devoid of electrically conductive material may be used for connecting materials, such as films, which are made from olefinic addition and condensation polymers.

It is preferred that the compositions of this invention be cured at temperatures of at least 100° C. and more preferably at temperatures of from about 170° to 200° C., in order to obtain the desired adhesion within a very short period of time, generally from 2 to 30 minutes.

In the following examples all parts and percentages are by weight, unless otherwise specified.

EXAMPLE 1

(a) About 100 parts of a diorganopolysiloxane which contains vinyldimethylsiloxy groups as terminal units with 0.2 mol percent vinylmethylsiloxane units and a viscosity of approximately $3 \times 10^6$ cSt at 25° C. with the remaining organic radicals being methyl groups are mixed on a rolling mill with 60 parts of acetylene black having an average particle size of 56 millimicrons, a BET-surface area of approximately 70 m$^2$/g and a specific electrical resistance, measured at room temperature and a pressure of 200 kp/cm$^2$ or 200 kg/cm$^2$ of 0.14 Ohm. cm, 15 parts of pyrogenically produced silicon dioxide with a BET-surface area of approximately 130 m$^2$/g, 2 parts dimethylsiloxanols, which on the average contain 4 percent by weight of Si-bonded hydroxyl groups, and 3 parts of a mixed hydrolysate of methyldichlorosilane and trimethylchlorosilane at a weight ratio of 1,000 to 51.5 with a viscosity of about 30 cSt at 25° C. and about 1.6 percent by weight of Si-bonded hydrogen. After 8 days of storage the mixture thus obtained is dispersed in 700 parts of trichloroethylene. The thus obtained 15 percent dispersion is mixed with 0.05 percent based on the weight of the dispersion with a 1 percent solution of chloroplatinic acid in isopropanol.

(b) Two opposing edges of a fiberglass resistor material for area heating resistors which has been coated with electrically conductive organopolysiloxane elastomer and which measures 10 by 10 cm and has a square resistance of 432 Ohm, measured with two 12 cm long retention electrodes which were held by constant spring pressure and which on the two inner sides were equipped with smooth massive silver sheetmetal, are coated with the catalyzed dispersion whose preparation was described in Example 1(a) above. Two copper wire webs which measure 12 cm by 5 mm which were previously immersed in the above mentioned catalyzed dispersion are pressed upon the thus coated edges as electrodes. They are then heated for 5 minutes at 120° C. and for 3 minutes at 180° C. Good adhesion is achieved between the electrodes and the resistors and the connection is extremely flexible. The square resistance of the thus obtained area heating resistor is now 430 Ohm and does not change even when the electrically conductive connections between the resistors and the electrodes are bent.

EXAMPLE 2

Two opposing edges of a resistor material which consists of an electrically conductive polyester film (Kalle Aktiengesellschaft 6202 Wiesbaden-Biebrich, Germany), which is used for area heating resistors and which measures 10 by 10 cm and has a square resistance of 772 Ohm as measured with the retention electrodes described in Example 1, are coated with a catalyzed dispersion which was prepared in accordance with Example 1(a). Two copper bands measuring 10 cm by 5 mm by 0.2 mm are pressed on the coated edges in order to serve as electrodes. They are then heated for 5 minutes at a temperature of from 180° to 200° C. with a flat iron. The square resistance of the thus obtained area heating resistor is now 770 Ohm and the electrical conductivity does not change when the connections between the resistors and the electrodes are bent.

EXAMPLE 3

(a) The procedure described under Example 1(a) is repeated, except that 25 parts of pyrogenically produced silicondioxide having a BET-surface area of approximately 200 m$^2$/g are substituted for the acetylene black and 8 parts of dimethylsiloxanol is substituted for the 2 parts of dimethylsiloxanols.

(b) Each edge of a polyimide film (commercially available under the Registered Trademark "Kapton") which measures $11 \times 11$ cm is immersed to a depth of about 5 mm into the catalyzed dispersion whose preparation was described in Example 3(a). The solvent was then evaporated by heating to 120° C. for 3 minutes. Subsequently the area heating resistor whose preparation was described in Example 1(b), is placed between the two polyimide films so that the edges of the heating resistors are always the same distance from the edges of the polyimide film. The jutting edges of the two polyimide films are then held down with four clips for a length of 12 cm and heated for 5 minutes at a temperature of from 180° to 200° C. This results in the hermetic encapsulation of the area heat resistors. Only the ends of the electrodes emerge from the capsule. The device is heated for 24 hours at 200° C. in order to test the heat resistance of the adhesive bond. No decrease in adhesion was observed.

EXAMPLE 4

Three sheets of a polyimide film each measuring 1.5 cm $\times$ 10 cm and three sheets of a polyethylene terephthalate film (commercially available under the Trademark "Hostaphan") are immersed on their narrow sides to a depth of 10 mm into the catalyzed dispersion whose preparation is described in Example 3(a). The solvent is then evaporated by heating for 3 minutes. Thereafter 2 sheets of the polyethylene terephthalate film and 2 sheets of the polyimide film or 1 sheet of the polyethylene terephthalate film and 1 sheet of the polyimide film are placed on each other on the coated ends and heated for 5 minutes at a temperature of about 180° C. while the touching surfaces are slightly pressed against each other. When the strength of the adhesive bond is tested in a tearing machine, the sheets tear only in areas which have not been glued.

What is claimed is:

1. A method for bonding plastic films prepared from organic polymers which comprises coating each surface of the plastic film with a composition consisting essentially of (a) a vinyl containing organopolysiloxane having the formula $$R_2(CH_2=CH)SiO(R'_2SiO)_n SiR_2 (CH=CH_2)$$

wherein R is selected from the group consisting of methyl and phenyl radicals, R' is selected from the group consisting of methyl, vinyl and phenyl radicals, n is a number sufficient to provide an organopolysiloxane having a viscosity of at least 100,000 cP at 25° C. in which 0.1 to 1 mol percent of the diorganopolysiloxane units are vinylmethylsiloxanes and at least 90 percent of the remaining organic radicals consist of methyl radicals, (b) an organopolysiloxane containing at least three Si-bonded hydrogen atoms in which the Si-bonded hydrogen atoms are present in an amount of from 0.01 to 1.7 weight percent and (c) a catalyst which promotes the addition of Si-bonded hydrogen atoms to the vinyl groups, intimately contacting the coated surfaces and thereafter heating to a temperature of from 100° to 200° C.

2. The method of claim 1 wherein the organic polymer is a polyimide film.

3. The method of claim 1 wherein the organic polymer is a polyethylene terephthalate film.

4. The method of claim 1 wherein the catalyst is a Group VIII element.

5. The method of claim 1 wherein the composition contains a reinforcing filler having a surface area of at least 50 $m^2/g$.